United States Patent
Kong et al.

(10) Patent No.: US 7,119,596 B2
(45) Date of Patent: Oct. 10, 2006

(54) WIDE-RANGE PROGRAMMABLE DELAY LINE

(75) Inventors: Cheng-Gang Kong, Saratoga, CA (US); Victor Suen, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 2 days.

(21) Appl. No.: 11/021,361

(22) Filed: Dec. 22, 2004

(65) Prior Publication Data

US 2006/0132210 A1 Jun. 22, 2006

(51) Int. Cl.
*H03H 11/26* (2006.01)
(52) U.S. Cl. .................. 327/261; 327/276; 327/158
(58) Field of Classification Search ...... None
See application file for complete search history.

(56) References Cited

U.S. PATENT DOCUMENTS

| | | | | |
|---|---|---|---|---|
| 4,805,021 A | * | 2/1989 | Harlos et al. | 348/536 |
| 5,712,582 A | * | 1/1998 | Yokota et al. | 327/156 |
| 6,204,710 B1 | * | 3/2001 | Goetting et al. | 327/276 |
| 6,292,040 B1 | * | 9/2001 | Iwamoto et al. | 327/158 |
| 6,483,359 B1 | * | 11/2002 | Lee | 327/158 |
| 6,765,976 B1 | * | 7/2004 | Oh | 375/376 |
| 2005/0248377 A1 | * | 11/2005 | Drexler et al. | 327/158 |

* cited by examiner

*Primary Examiner*—Timothy P. Callahan
*Assistant Examiner*—An T. Luu
(74) *Attorney, Agent, or Firm*—Christopher P. Maiorana

(57) ABSTRACT

An apparatus comprising an input section, a first delay circuit and a second delay circuit. The input section may be configured to present a first intermediate signal by selecting either (i) an input clock signal or (ii) a feedback of an output signal. The first delay circuit may be configured to generate a second intermediate signal by delaying the first intermediate signal by inserting one of a plurality of fixed delays in response to a first control signal. The second delay circuit may be configured to generate the output signal by delaying the second intermediate signal by inserting a programmable delay in response to a second control signal.

20 Claims, 4 Drawing Sheets

WIDE-RANGE PROGRAMMABLE DELAY LINE

FIELD OF THE INVENTION

The present invention relates to delay lines generally and, more particularly, to a programmable delay line that may be used in a memory interface.

BACKGROUND OF THE INVENTION

Conventional wide range programmable delay cells consume a relative large amount of silicon die area. In most conventional delay lines, a delay chain is made of a number of delay elements. Each delay element provides a relatively equal delay, which results in a fairly large delay chain with respect to silicon area.

Designers normally try to minimize the silicon area by carefully laying out the cell and trying to compact the logic as much as possible. In addition, careful layout techniques are used to balance out each step so that every delay step produces similar delay value.

Implementing a conventional delay cell takes design effort when trying to match the delay for each delay step as well while trying to minimize die size.

It would be desirable to implement a delay cell that is easy to implement and has efficient die usage.

SUMMARY OF THE INVENTION

The present invention concerns an apparatus comprising an input section, a first delay circuit and a second delay circuit. The input section may be configured to present a first intermediate signal by selecting either (i) an input clock signal or (ii) a feedback of an output signal. The first delay circuit may be configured to generate a second intermediate signal by delaying the first intermediate signal by inserting one of a plurality of fixed delays in response to a first control signal. The second delay circuit may be configured to generate the output signal by delaying the second intermediate signal by inserting a programmable delay in response to a second control signal.

The objects, features and advantages of the present invention include implementing a delay cell that may (i) be implemented as a programmable cell (ii) have a coarse and a fine calibration, and/or (iii) be implemented with less layout effort than conventional approaches.

BRIEF DESCRIPTION OF THE DRAWINGS

These and other objects, features and advantages of the present invention will be apparent from the following detailed description and the appended claims and drawings in which:

DESCRIPTION OF THE PREFERRED EMBODIMENTS

Figure 1:
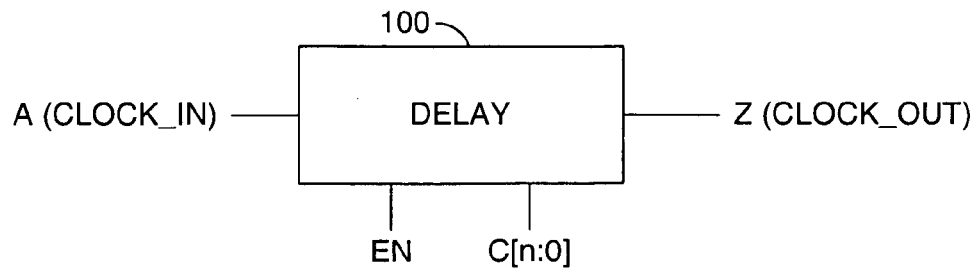
FIG. 1 is a diagram illustrating a context of the present invention.

The present invention may be used to implement an accurate and wide-range programmable delay line with an efficient use of silicon area. Referring to FIG. 1, a block diagram of a circuit 100 is shown in accordance with the preferred embodiment of the present invention. The circuit 100 generally presents a signal (e.g., Z) in response to a signal (e.g., A), a signal (e.g., EN) and a signal (e.g., C). The signal A may be an input clock input signal that oscillates at a particular frequency. The signal Z may be an output clock signal that oscillates at a particular frequency. The signal EN may be a clock enable signal. The control signal C may be a control signal. The signal C may be implemented as a multi-bit signal (e.g., C[n:0]). In one example, the control signal C may be implemented as an 8-bit signal. For example, 5 bits may be used to control a coarse delay and 3 bits may be used to control a fine delay. However, the combinations of coarse and fine bits may be varied to meet the design criteria of a particular implementation.

Figure 2:
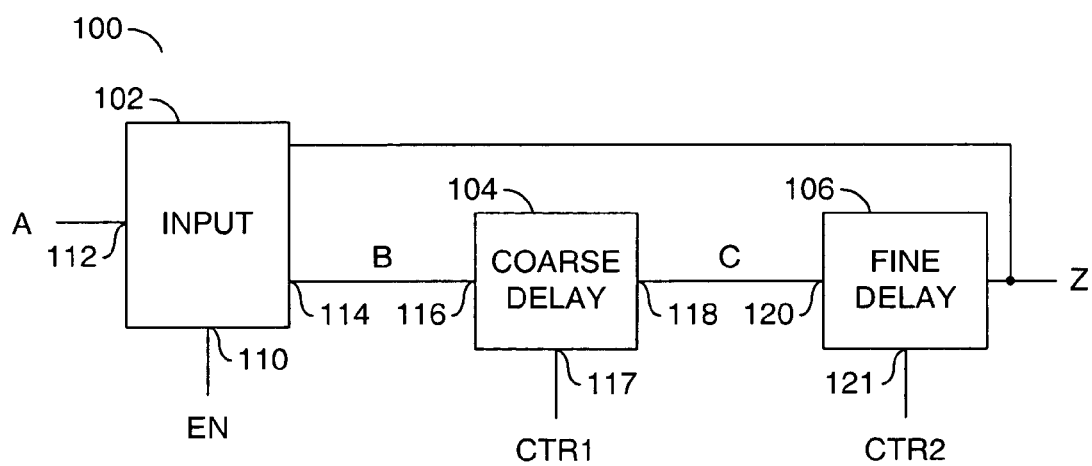
FIG. 2 is a block diagram of a preferred embodiment of the present invention.

Referring to FIG. 2, a more detailed block diagram of the circuit 100 is shown. The circuit 100 generally comprises an input section (or circuit) 102, a delay section (or circuit) 104 and a delay section (or circuit) 106. The delay section 104 may be implemented as a coarse delay section. The delay section 106 may be implemented as a fine delay section. The input section may have an input 110 that may receive the signal EN and an input 112 that may receive the signal A. The signal A may be an input clock signal oscillating at a particular frequency. The circuit 102 may have an output 114 that may present an intermediate signal (e.g., B) to an input 116 of the delay circuit 104. The delay circuit 104 may have an output 118 that may present an intermediate signal (e.g., C) to an input 120 of the delay circuit 106. The circuit 104 has an input 117 that may receive a signal (e.g., CTR1). The signal CTR1 represents the coarse control bits of the control signal C[n:0]. Similarly, the delay circuit 106 may have an input 121 that may receive a signal (e.g., CTR2). The signal CTR2 may represent the fine delay control bits of the control signal C[n:0]. The particular number of bits of the signal CRT1 and the signal CTR2 may be varied to meet the design criteria of a particular implementation.

The input section 102 generally provides a balanced input selection logic that may allow the circuit 100 to be used in either a feedback mode or an input mode. In the feedback mode, the input section 102 uses the signal Z. In the input mode, the circuit 102 uses the signal A. The coarse delay section 104 may be used to provide the bulk of the delay provided by the circuit 100. In one example, a plurality of coarse delay sections 104 may be cascaded to provide additional delay needed to meet the design criteria of a particular implementation. The fine delay section 106 may be used to establish precision control of the delay cell 100. For example, the fine delay section 106 may provide additional delay between the delay steps provided by the circuit 104.

The fine delay circuit 106 may implement the fine delay as the difference between the total fine delay and one coarse delay step (or increment) less than one fine delay step (or increment). The circuit 100 may achieve the accuracy of the fine delay section 106 without incurring the cost of implementing the entire design with accurate fine delay steps. Most of the delay for the entire application range is implemented through the coarse delay cells (to be described in more detail in connection with FIG. 3). Since the coarse delay cells are more area efficient than the fine delay circuit 106, the circuit 100 has an efficient use of chip area.

Figure 3:
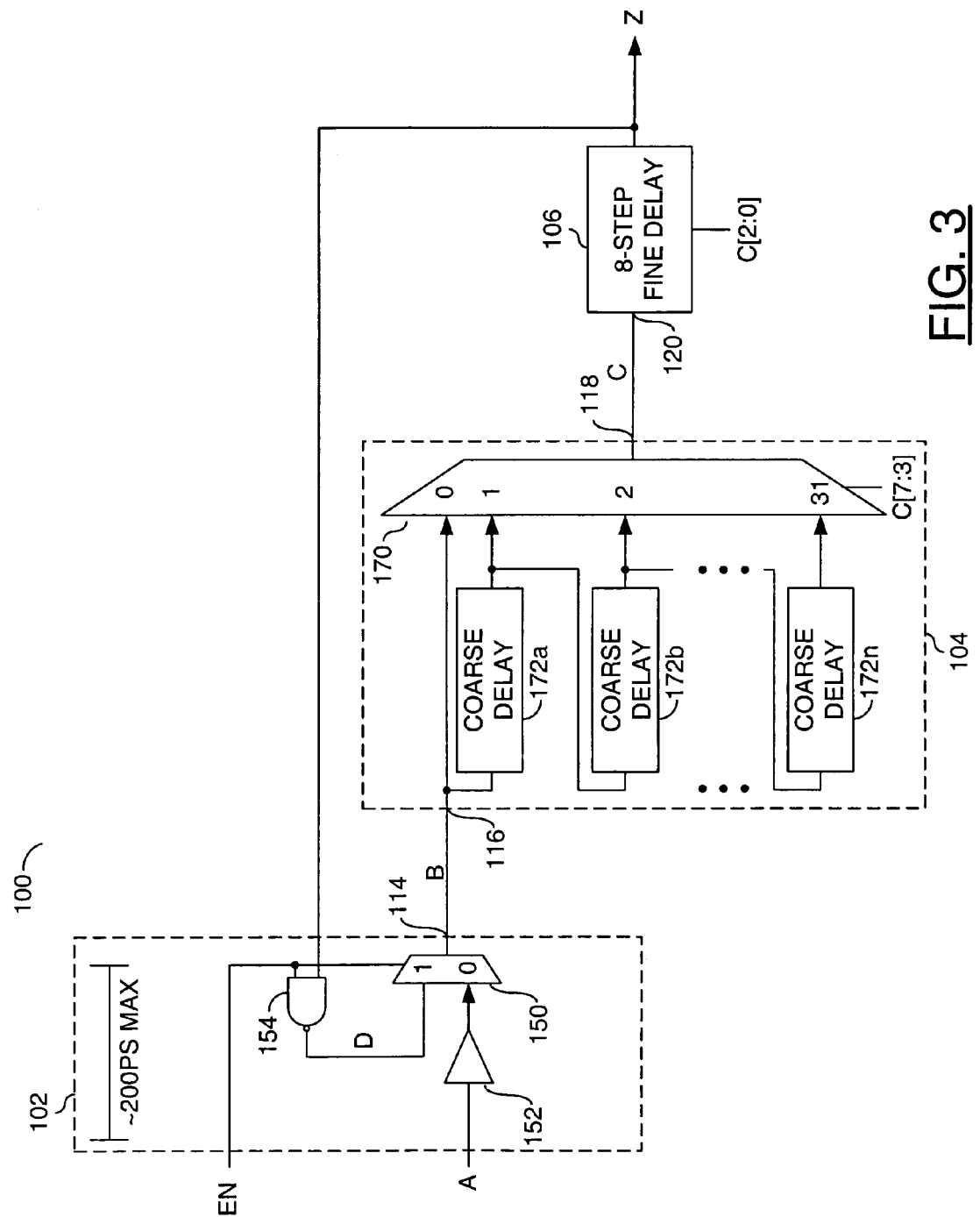
FIG. 3 is a more detailed diagram of the present invention.

Referring to FIG. 3, a more detailed diagram of the circuit 100 is shown. The input section 102 is shown implemented with a multiplexer 150, a buffer 152 and a gate 154. In one example, the gate 154 may be implemented as a NAND gate. However, other gates, or gate combinations, may be implemented to meet the design criteria of a particular implementation. The gate 154 generally has one input that receives a feedback of the signal Z and another input that receives the signal EN. The gate 154 presents a signal (e.g., D) to a first input of the multiplexer 150. The second input of the multiplexer 150 is normally received from the buffer 152. The multiplexer 150 also receives the signal EN. The multiplexer 150 presents the signal B in response to the signal A, the signal D and the signal EN. In one example, the total propagation delay of the circuit 102 is normally less than 200 pS.

The circuit 104 generally comprises a multiplexer 170 and a number of delay elements 172a–172n. The multiplexer 170 may be implemented, in one example, as a 32-bit multiplexer. However, other bit-width multiplexers may be implemented to meet the design criteria of a particular implementation. The delay elements 172a–172nmay be implemented as coarse delay elements (to be described in more detail in connection with FIG. 5). Each of the coarse delay elements 172a–172n provides, preferably 100–200 pS, more preferably 125–175 pS, or most preferably 150 pS of delay. The ranges provided are examples only. As process technologies improve, the delay of each of the delay elements 172a–172n may be adjusted downward (or upward) to be appropriate for current applications. The delay element 172a presents a signal to an input "1" of the multiplexer 170. Additionally, the output of the delay element 172a is also presented to an input of the delay element 172b. An output of the delay element 172b is presented to an input "2" of the multiplexer 170. In general, the input 0 of the multiplexer 170 has a zero delay, the input 1 of the multiplexer 170 is delayed by the amount of the delay element 172a. The input 2 of the multiplexer 170 is delayed by the amount of delay of the delay element 172a plus the amount of delay of the delay element 172b. In general, each successive input to the multiplexer 170 provides a delay equal to the accumulated delays of each of the previous inputs. By selecting one of the inputs, the multiplexer 170 presents a particular amount of delay on the intermediate signal C.

While the delay elements 172a–172n are shown essentially serially connected, a parallel configuration may also be implemented. With a parallel configuration, each delay element may be used to present a different delays. The signal B may be presented to each of the inputs of the delay elements 172a–172n to generate the different delays. For example, the delay element 172a may present a 1× delay, the delay element 172b may present a 2× delay, etc.

Figure 4:
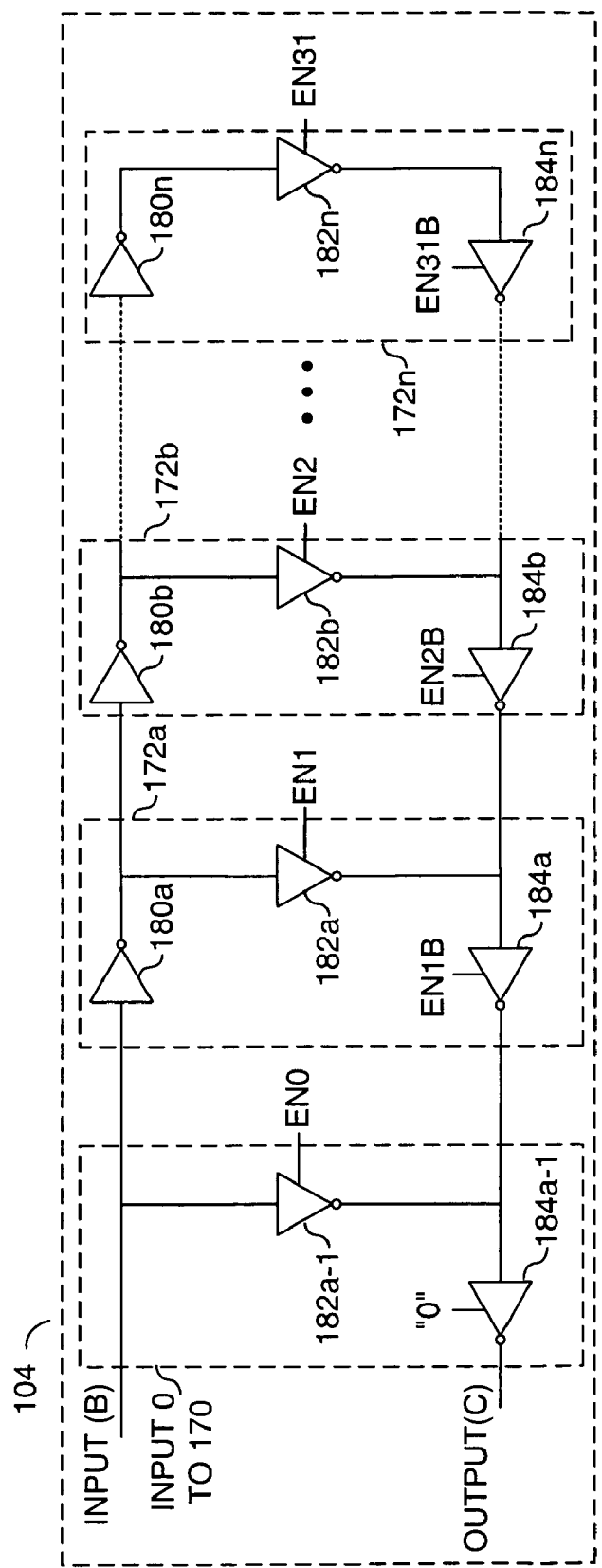
FIG. 4 is a diagram illustrating an example of the coarse delay cells.

Referring to FIG. 4, a diagram illustrating an example of the circuit 104 is shown. The circuit 104 generally comprises the individual coarse delay elements 172a–172n along with the multiplexer 170. The entire circuit 104 generally comprises a number of inverters 180a–180n, a number of inverters 182a-1 and 182a–182n and a number of inverters 184a–1 and 184a–184n. The inverters 182a-1, 182a–182n, 184a-1 and 184a–184n may be implemented as tri-state inverters. The inverter 182a-1 and the inverter 184a–1 make up the undelayed input 0 to the multiplexer 170. The inverters 180a, 182a and 184a make up the coarse delay element 172a. The inverters 180b, 182b and 184b generally make up the coarse delay element 172b. The pattern generally repeats for each of the other coarse delay elements 172c–172n. The inverters 180a–180n are generally implemented without enable signals. The inverters 182a–182n are generally implemented to receive one of a number of enable inputs (e.g., ENO-EN31). The inverters 184a–184n generally receive one of a number of enable inputs (e.g., ENO-EN31). In the example shown, 31 coarse delay elements 172a–172n are implemented. However, other variations may be implemented to meet the design criteria of a particular implementation.

The circuit 100 may be used in a memory, a memory interface, or a memory controller, such as a DDR memory, interface and/or controller. A typical example of a DDR memory interface operates at clock speeds from about 100 MHz to 200 MHz, which results in data transfer rates from 200 MB/s to 400 MB/s. Data rates are expected to increase with improved process technologies. In any event, data in a DDR memory is typically sent at twice the clock rate. Therefore, in a DDR memory, data is read on both the rising and falling edges of the strobe (or clock) signal. The DDR interface is source-synchronous, meaning that the data and clock (or strobe) signals are sent together on the same bus. In the case of a DDR SDRAM, the clock (or strobe) and the data signals are edge-aligned during the read cycle. During the write cycle, the strobe is delayed 90 degrees with respect to the clock.

Since the data and strobe signals are edge-aligned during the read cycle, the strobe is normally shifted inside the memory controller in order to provide setup and hold time for the flip-flops inside an Application Specific Integrated Circuit (ASIC). The shift of the strobe, commonly known as clock forwarding, may be implemented with a delay cell such as the circuit 100.

The delay cell 100 provides a tightly-controlled delay in a strobe signal data path between a buffer fed by a system memory controller logic and a receiver in the DDR memory device. The strobe is offset with respect to input data by approximately ¼ clock cycle.

The delay cell 100 may also provide an oscillation feature. The propagation between the signal CLOCK_IN (A) and the signal CLOCK_OUT (Z) is half the clock cycle in certain applications. The signal EN may be used to enable the oscillation. For example, when the signal EN="0", oscillation may be enabled.

Examples of typical design criteria are listed in the following TABLE 1:

TABLE 1

| Parameter | Criteria | Units |
| --- | --- | --- |
| Technology | 0.11 um CMOS | |
| Operating Voltage Range(s) | 1.2 +/− 10% | V |
| Temperature Range | −40 to 125 | deg. C |
| System Clock Speed | 100 to 200 | MHZ |
| Duty Cycle | 49/51 | |
| Fine Delay Step Size | 35 | ps |
| Coarse delay | 150 | ps |
| Input ramp rise time | 120 from 20% to 80% | ps |

Figure 6:
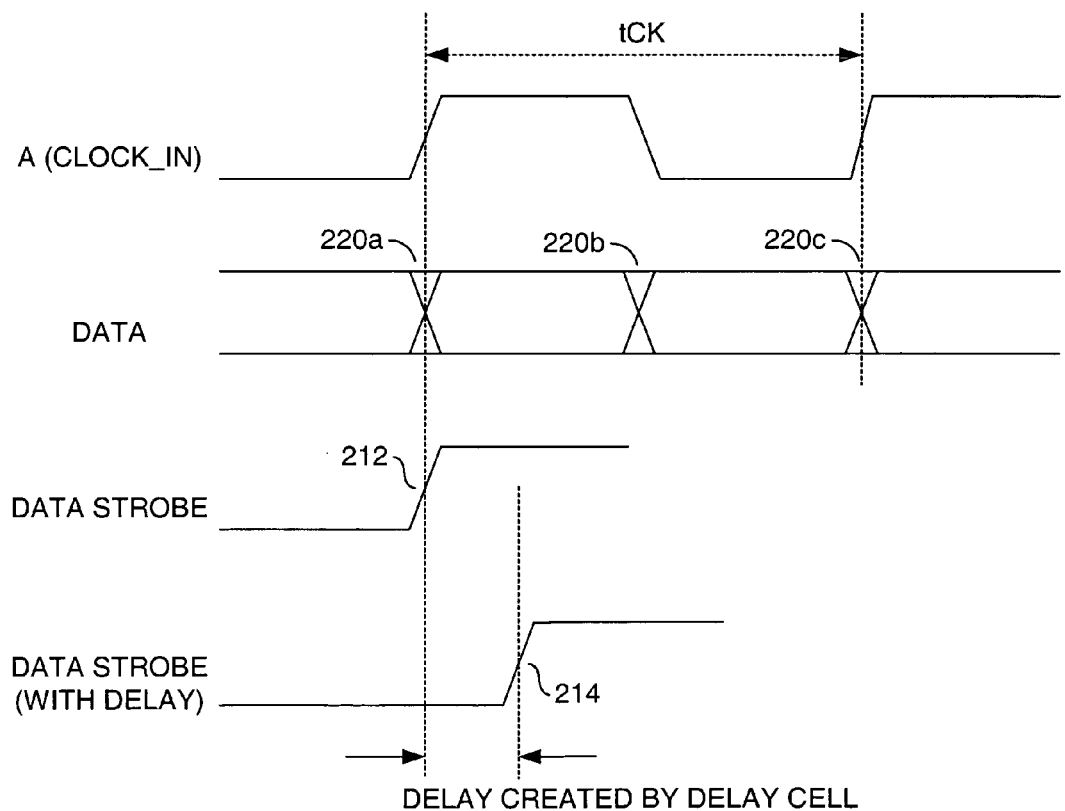
FIG. 6 is a timing diagram illustrating the various parameters of the present invention.

Referring to FIG. 6, a timing diagram illustrating the various waveforms is shown. The circuit 100 is used to delay a Data Strobe signal (e.g., DQS) presented to the flip-flop at the clock input inside the memory controller during the double-data-rate memory read cycle. The circuit 100 provides optimal setup and hold time for the data signal (e.g., DQ).

The delay cell 100 is not normally used when data is written to a memory. During data writes, a DDR memory typically needs a strobe that is shifted 90 degrees with respect to the clock signal. In one example, this may be accomplished inside the memory controller ASIC by shifting data out with a 2× clock, and placing an inverter at the input of the flip-flop of the strobe signal. Other methods may be used for such a data shift.

The delay cell 100 will normally be used in a read operation. The goal (during reads) is to delay the strobe such that set-up and hold will be optimal when the data signal DQ and the strobe signal DOS reach the inputs to the flip-flops inside the memory controller. The amount of delay has to take into consideration the skew between the fastest and slowest of all of the data signals in a group, such as a group of eight data lines. The skew between the data lines should be small enough to allow for set-up and hold with respect to the respective strobe signals. Sources of skew between any two of the eight data lines or any one of the eight data lines and a respective strobe line typically originate from sources such as board trace length differences, crosstalk, differences in rise times and fall times, receiver duty cycle, routing inside the memory controller ASIC and fanout, etc.

The present invention implements a delay cell with coarse and fine delay elements along with a decoder and control logic. The basic delay element is a standard logic component so a rising input results in a rising output. In one example, the base delay element comprises 32 blocks of such cascadable components connected in series. However, other implementations of the delay elements, such as an 8 block, a 16 block, a 64 block implementation, etc. may be used to meet the design criteria of a particular implementation. An example of the coarse delay element comprises 3 3-state inverters (except the first one which consists of only 2 3-state inverters). Each coarse delay is around 150 ps at nominal conditions. An example of the fine delay element comprises four steps of eight delays. However, other delays may be implemented to meet the design criteria of a particular implementation.

The circuit 100 implements an array of delay elements 172a–172n arranged such that any number of the elements may be chosen from one delay element to the maximum of all delay elements combined. For best case (e.g., fastest) process voltage and temperature (PVT) variations, the delay is about 2.5 ns (e.g., one-fourth of 10.0ns), to allow for one (100 MHz) clock cycle delay. For worst-case (slowest) PVT, the minimum delay should normally not be greater than 1.25 ns (one-fourth of 5.0 ns, 200 MHZ). These parameters are provided as examples only. Other parameters may be implemented to meet the design criteria of a particular implementation.

As discussed in connection with FIGS. 2 and 3, the circuit 100 is generally controlled by the delay control signal C[n:0], which determines the delay value through the multiplexer 170. The following TABLE 2 illustrates how the circuit 100 operates based on the various signals.

TABLE 2

| Pin Name | Symbol* | Pin Description |
| --- | --- | --- |
| Input | A | Input of the delay cell |
| Output | Z | Output of the delay cell |
| Enable | EN | Enable oscillation when EN = "0" |
| Control | C[n:0] | Control pins of the delay cell to determine the delay time |

In one example, the circuit 100 may be used in a DDR memory operating at 200 Mb/s (e.g., a 100 MHz clock), 266 Mb/s (e.g., a 133 MHz clock), 333 Mb/s (e.g., a 166 MHz clock), and/or 400 Mb/s (e.g., a 200 MHz clock). However, other data rates and/or clock speeds may be implemented to meet the design criteria of a particular implementation.

The following TABLE 3 illustrates how the circuit 100 operates with additional parameters selected:

TABLE 3

| Input A | EN | C[n:0] with different programmed delays | Output Z |
| --- | --- | --- | --- |
| 1 | 1 | any | 1 |
| 0 | 1 | any | 0 |
| any | 0 | any | oscillates |

Figure 5:
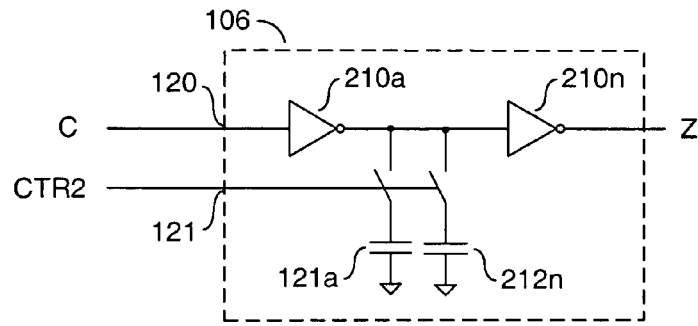
FIG. 5 is a diagram illustrating an example of the fine delay cell.

Referring to FIG. 5, an example of the fine delay circuit 106 is shown. The circuit 106 generally comprises a number of buffers 210a–210n and a number of capacitors 212a–212n. The buffers 210a–210n may be implemented as inverters, buffers or other appropriate delay creating devices. The capacitors 212a–212n are generally connected to align between the inverters 210a–210n. The control signal CTR2 generally comprises a multi-bit signal with each bit either connecting or disconnecting one of the capacitors 212a–212n.

Referring back to FIG. 6, a timing diagram illustrating the operation of the present invention is shown. A clock signal CLK_IN is shown as a periodic signal. One period of the signal (e.g., tCK) is shown. A signal DATA is shown having a number of transitions 220a–220n. A data strobe signal is shown having a transition 212. The transition 212 marks the beginning of the delay created by the circuit 100. A transition 214 shows the end of the delay created with the circuit 100.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   an input section configured to present a first intermediate signal by selecting (i) an input clock signal when said apparatus is in input mode and (ii) a feedback of an output signal when said apparatus is in a feedback mode;
   a first delay circuit configured to generate a second intermediate signal by delaying said first intermediate signal by inserting a first delay comprising one or more fixed increments in response to a first control signal, wherein each of said fixed increments provides a fixed and equal delay; and
   a second delay circuit configured to generate said output signal by delaying said second intermediate signal by inserting a second delay in response to a second control signal, wherein said second delay is programmable and different than said fixed increments.

2. The apparatus according to claim 1, wherein said first delay circuit comprises a coarse delay circuit configured to generate a substantial amount of delay to allow for the die size of said apparatus to be reduced.

3. The apparatus according to claim 1, wherein said second delay circuit comprises a fine delay circuit configured to provide precision delay for said apparatus.

4. The apparatus according to claim 1, wherein said first delay circuit comprises a plurality of coarse delay elements presented to a multiplexer, wherein said multiplexer selects one of said coarse delay elements in response to said first control signal.

5. The apparatus according to claim 1, further comprising:
a plurality of first delay circuits, each configured to add one or a plurality of delays.

6. The apparatus according to claim 1, wherein (i) said second delay comprises one or more fine delay increments and (ii) a delay difference between said first delay circuit and said second delay circuit is less than said one fine delay increment.

7. The apparatus according to claim 6, wherein said delay difference is equal to said one fixed increment minus a total of said one or more fine delay increments.

8. The apparatus according to claim 1, wherein said input section is configured to receive a clock enable signal to control the selection between said input clock signal and said feedback of an output signal.

9. The apparatus according to claim 8, wherein said input section comprises a multiplexer configured to select between said input clock signal and said feedback of an output in response to said clock enable signal.

10. An apparatus comprising:
means for presenting a first intermediate signal by selecting (i) an input clock signal when said apparatus is in an input mode and (ii) a feedback of an output signal when said apparatus is in a feedback mode;
means for generating a second intermediate signal by delaying said first intermediate signal by inserting a fixed delay comprising one or more fixed increments in response to a first control signal, wherein each of said fixed increments provides a fixed and equal delay; and
means for generating said output signal by delaying said second intermediate signal by inserting a second delay in response to a second control signal, wherein said second delay is programmable and different than said fixed increments.

11. A method for implementing a programmable delay comprising the steps of:
(A) presenting a first intermediate signal by selecting (i) an input clock signal when in an input mode and (ii) a feedback of an output signal when in a feedback mode;
(B) generating a second intermediate signal with a first delay circuit by delaying said first intermediate signal by inserting a first delay comprising one or more fixed increments in response to a first control signal, wherein each of said fixed increments provides a fixed and equal delay; and
(C) generating said output signal with a second delay circuit by delaying said second intermediate signal by inserting a programmable delay in response to a second control signal, wherein said second delay is programmable and different than said fixed increments.

12. The method according to claim 11, wherein step (B) implements a coarse delay to generate a substantial amount of delay and allow for a reduction of die size.

13. The method according to claim 11, wherein step (C) implements a fine delay circuit to provide precision delay.

14. The method according to claim 11, wherein step (B) is implemented with a plurality of coarse delay elements presented to a multiplexer, wherein said multiplexer selects one of said coarse delay elements in response to said first control signal.

15. The method according to claim 11, wherein said method is implemented in a memory interface.

16. The method according to claim 11, wherein said method is implemented in a double data rate memory interface.

17. The method according to claim 11, wherein (i) said second delay comprises one or more fine delay increments and (ii) a delay difference between said first delay circuit and said second delay circuit is less than said one fine delay increment.

18. The method according to claim 17, wherein said delay difference is equal to said one fixed increment minus a total of said one or more fine delay increments.

19. The method according to claim 11, wherein step (A) further comprises the step of:
receiving a clock enable signal to select between said input clock signal and said feedback of an output signal.

20. The method according to claim 19, further comprising the step of:
presenting said clock enable signal to a multiplexer to select between said input clock signal and said feedback of an output signal.

* * * * *